(12) United States Patent
Archer

(10) Patent No.: US 6,734,570 B1
(45) Date of Patent: May 11, 2004

(54) SOLDER BUMPED SUBSTRATE FOR A FINE PITCH FLIP-CHIP INTEGRATED CIRCUIT PACKAGE

(75) Inventor: John Archer, Mississauga (CA)

(73) Assignee: Gennum Corporation (CA)

( * ) Notice: Subject to any disclaimer, the term of this patent is extended or adjusted under 35 U.S.C. 154(b) by 0 days.

(21) Appl. No.: 10/350,851

(22) Filed: Jan. 24, 2003

(51) Int. Cl.[7] .................. H01L 23/48; H01L 23/52; H01L 29/40
(52) U.S. Cl. ..................................... 257/786
(58) Field of Search .................. 257/737, 773–775, 257/786, 779, 780, 784; 361/772–774, 777; 174/250, 261; 438/612; 228/164, 178, 179.1, 180.21, 180.22

(56) References Cited

U.S. PATENT DOCUMENTS

| | | | |
|---|---|---|---|
| 4,164,778 A | * | 8/1979 | Sawairi et al. ............... 361/777 |
| 4,290,079 A | | 9/1981 | Carpenter et al. |
| 5,284,796 A | | 2/1994 | Nakanishi et al. |
| 5,300,815 A | | 4/1994 | Rostoker |
| 5,349,495 A | | 9/1994 | Visel et al. |
| 5,404,047 A | * | 4/1995 | Rostoker et al. ............ 257/786 |
| 5,406,458 A | * | 4/1995 | Schutt ......................... 361/767 |
| 5,712,192 A | | 1/1998 | Lewis et al. |
| 5,795,818 A | | 8/1998 | Marrs |
| 5,838,069 A | | 11/1998 | Itai et al. |
| 5,844,308 A | | 12/1998 | Dedert et al. |
| 5,889,326 A | | 3/1999 | Tanaka |
| 5,923,955 A | | 7/1999 | Wong |
| 5,965,944 A | | 10/1999 | Frankoski et al. |
| 5,998,875 A | | 12/1999 | Bodo et al. |
| 6,071,801 A | | 6/2000 | Wachtler et al. |
| 6,074,895 A | | 6/2000 | Dery et al. |
| 6,080,650 A | | 6/2000 | Edwards |
| 6,087,732 A | | 7/2000 | Chittipeddi et al. |
| 6,121,069 A | | 9/2000 | Boyko et al. |
| 6,137,185 A | | 10/2000 | Ishino et al. |
| 6,147,413 A | | 11/2000 | Farnworth |
| 6,162,660 A | | 12/2000 | LaFontaine, Jr. et al. |
| 6,163,463 A | | 12/2000 | Marrs |
| 6,187,658 B1 | | 2/2001 | Chittipeddi et al. |
| 6,194,667 B1 | * | 2/2001 | Jimarez et al. ............. 174/261 |
| 6,201,305 B1 | | 3/2001 | Darveaux et al. |
| 6,221,693 B1 | | 4/2001 | Ho |
| 6,222,738 B1 | | 4/2001 | Maeno et al. |
| 6,225,699 B1 | | 5/2001 | Ference et al. |
| 6,380,060 B1 | | 4/2002 | Zohni |
| 6,404,064 B1 | | 6/2002 | Tsai et al. |
| 6,410,415 B1 | | 6/2002 | Estes et al. |
| 6,448,647 B1 | | 9/2002 | Kurita et al. |
| 6,590,296 B2 | * | 7/2003 | Nakamura .................. 257/786 |

* cited by examiner

*Primary Examiner*—David A. Zarneke
(74) *Attorney, Agent, or Firm*—Jones Day

(57) ABSTRACT

A method of fabricating a solder bumped substrate for a flip-chip integrated circuit (IC) package is provided. The method includes the following steps. Providing a substrate material. Patterning a conductive layer on the substrate material that includes a plurality of circuit traces coupled to a plurality of bonding pads, wherein the bonding pads are arranged to correspond to input/output (I/O) pads on the flip-chip IC. Fabricating a solder mask layer over the conductive layer, wherein the solder mask layer defines a pad opening corresponding to each of the bonding pads, and wherein the pad openings defined by the solder mask layer are tapered such that each pad opening includes an expanded end and a tapered end. Printing solder onto a portion of each bonding pad that is exposed by the expanded end of the corresponding pad opening. Reflowing the printed solder to form solder bumps on each bonding pad.

29 Claims, 4 Drawing Sheets

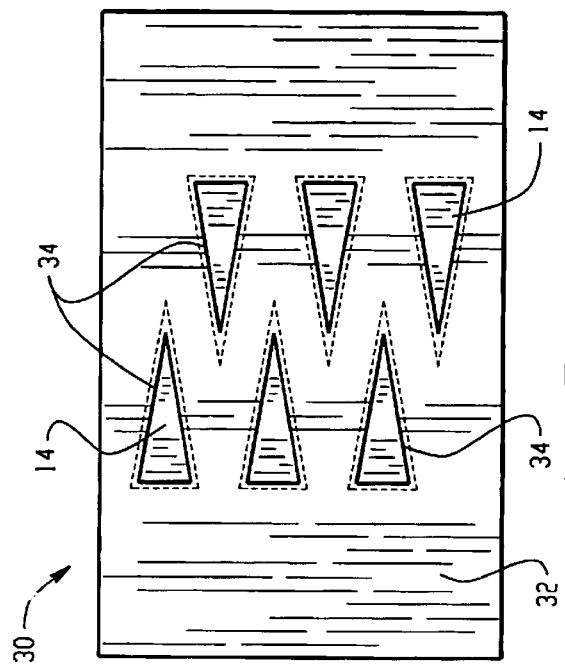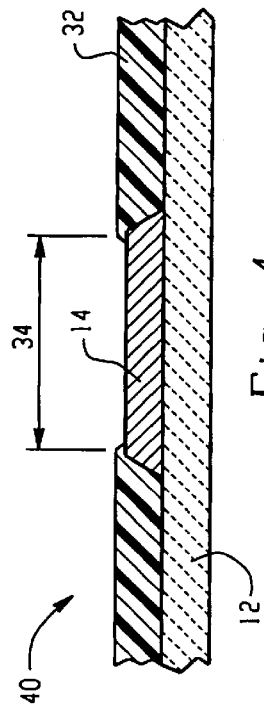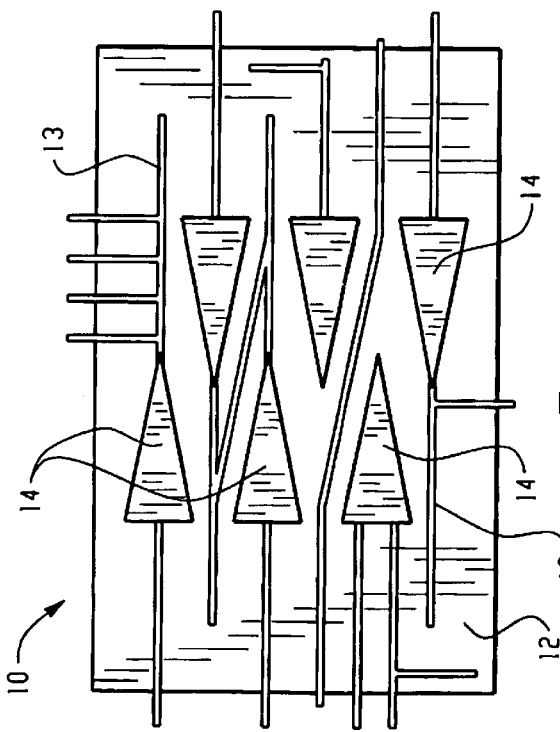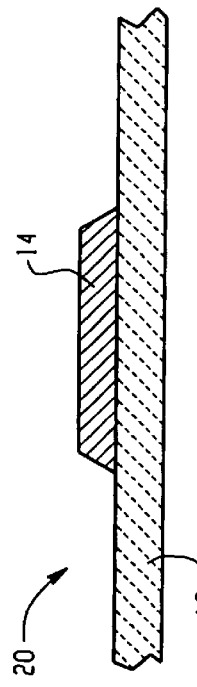

SOLDER BUMPED SUBSTRATE FOR A FINE PITCH FLIP-CHIP INTEGRATED CIRCUIT PACKAGE

FIELD OF THE INVENTION

This invention relates generally to the field of carrier substrate fabrication. More particularly, the invention provides a solder bumped substrate for a fine pitch flip-chip integrated circuit (IC) package.

BACKGROUND OF THE INVENTION

The demand for increased IC functionality and performance continues to drive an increase in the number of input/output (I/O) pads on a typical flip-chip IC package. At the same time, there is a rising demand for smaller sized ICs that are suitable for use in portable devices and other space-sensitive applications. As a result, the I/O pads on a typical flip-chip IC package have become increasingly smaller and more finely pitched. That is, there is less and less distance between adjacent I/O pads on a typical flip-chip IC package.

Various techniques for bonding a flip-chip IC package to a carrier substrate are known in this art. Many such techniques, however, are not well-suited for fine pitch flip-chip IC packages, and often are plagued by the formation of solder shorts between adjacent I/O pads.

SUMMARY

A solder bumped carrier substrate for a fine pitch flip-chip IC package includes a substrate material, a conductive layer, a solder mask layer and solder bumps. The conductive layer is fabricated on the substrate material and includes a plurality of circuit traces coupled to a plurality of bonding pads. The bonding pads are arranged to correspond to input/output (I/O) pads on the flip-chip IC package. The solder mask layer is fabricated over the conductive layer and defines a plurality of tapered pad openings that expose the bonding pads. The plurality of tapered pad openings each have a tapered end, and an expanded end and are interdigitated such that the tapered end of each tapered pad opening is adjacent to the tapered end of at least one other tapered pad opening. The solder bumps are coupled to the bonding pads through the tapered pad openings.

A method of fabricating a solder bumped substrate for a flip-chip integrated circuit (IC) package includes the following steps. Providing a substrate material. Patterning a conductive layer on the substrate material that includes a plurality of circuit traces coupled to a plurality of bonding pads, wherein the bonding pads are arranged to correspond to input/output (I/O) pads on the flip-chip IC. Fabricating a solder mask layer over the conductive layer, wherein the solder mask layer defines a pad opening corresponding to each of the bonding pads, and wherein the pad openings defined by the solder mask layer are tapered such that each pad opening includes an expanded end and a tapered end. Printing solder paste onto a portion of each bonding pad that is exposed by the expanded end of the corresponding pad opening. Reflowing the printed solder paste to form solder bumps on each bonding pad.

BRIEF DESCRIPTION OF THE DRAWINGS

FIGS. 1–8 illustrate an exemplary process for creating a solder bumped substrate for a fine pitch flip-chip IC package;

FIGS. 1 and 2 show the step of patterning a conductive layer on a substrate;

FIGS. 3 and 4 show the step of patterning a solder mask layer with high-precision tapered pad openings over the high density conductor layer;

FIGS. 5 and 6 show the step of patterning solder paste onto the bonding pads at the expanded ends of the tapered pad openings;

FIGS. 7 and 8 show the step of reflowing the solder paste to create the solder bumped substrate;

DETAILED DESCRIPTION

Figure 5:
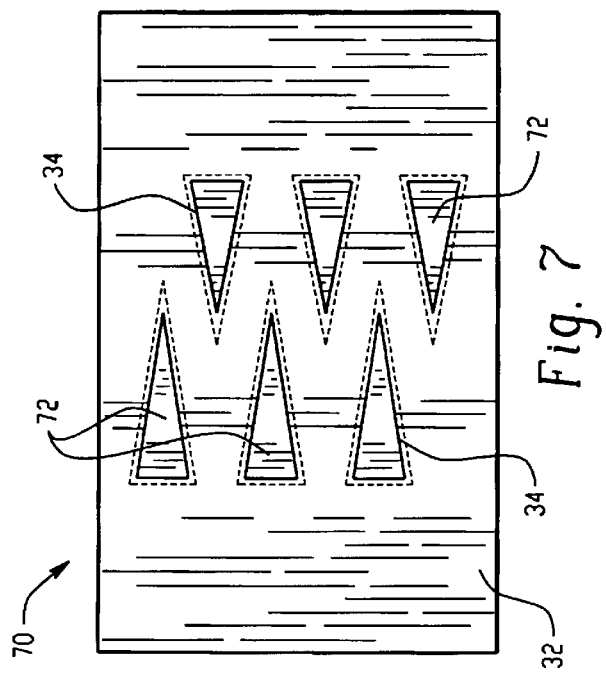

Referring now to the drawing figures, FIGS. 1–8 illustrate an exemplary process for creating a solder bumped substrate for a fine pitch flip-chip IC package. FIGS. 1 and 2 show the step of patterning a conductive layer 13, 14 on a substrate 12. FIG. 1 is a top view 10 showing the substrate 12 with the high-density conductor layer. The conductive layer includes tightly pitched circuit traces 13 and tapered bonding pads 14. It should be understood, however, that only a portion of the conductive layer 13, 14 is shown in FIG. 1. The bonding pads 14 are preferably patterned on the substrate 12 to correspond to the pattern of input/output (I/O) pads on a flip-chip IC package. FIG. 2 is a cross-sectional view 20 showing the substrate 12 and one bonding pad 14 from the conductive layer.

In order to achieve a tight pitch between the bonding pads 14, as shown in FIG. 1, the pads 14 are tapered and the tapered ends of the pads 14 are interdigitated. In the illustrated embodiment, the bonding pads 14 are tapered to form a triangle. In other embodiments, however, the bonding pads 14 could be patterned into different tapered shapes, or, alternatively, non-tapered bonding pads 14 could be used.

The substrate 12 may, for example, be a ceramic substrate, an organic-based circuit board substrate, or some other suitable type of substrate material. The conductor layer 13, 14 may, depending upon the type of substrate material, be fabricated by patterning a conductive thick film material, by etching a conductive laminate, or by some other known fabrication method. In a thick film circuit, for example, the conductor layer 13, 14 may be fabricated by patterning a conductive thick film material on a ceramic substrate using known thick film techniques. Typical conductive thick film materials contain a fine metal powder, such as copper (Cu), gold (Au), silver (Ag), palladium-silver (PdAg), platinum-silver (PtAg), palladium-gold (PdAu), or platinum-gold (PtAu). Bonding pads 14 and circuit traces 13 are typically patterned from such thick film materials by screen printing the conductive metallic paste onto a ceramic substrate, although to achieve a tighter pitch other patterning methods may be used, such as sputtering a thin-film conductor or a combination of screen printing, photolithography and wet chemical etching. In one exemplary embodiment, the conductor layer 13, 14 is patterned by chemically etching a gold (Au) thick film material to achieve a spacing of about 1 mil between circuit traces 13 and a pitch of about 4 mils between the tapered ends of adjacent bonding pads 14.

FIGS. 3 and 4 show the step of patterning a solder mask layer 32 with high-precision tapered pad openings 34 over the high density conductor layer 13, 14. FIG. 3 is a top view 30 of the solder mask layer 32, showing the tapered pad openings 34. The solder mask layer 32 is preferably fabricated from a photo-definable material suitable for creating a high-precision mask pattern using known photolithography techniques, however, other solder mask materials and fabrication techniques may also be utilized.

The solder mask layer 32 covers the circuit traces 13 and substrate 12 shown in FIG. 1, and overlaps the bonding pads 14 to form the tapered pad openings 34. The bonding pads 14, which are exposed through the tapered pad openings 34, are illustrated in FIG. 3 by dotted lines, indicating that the solder mask layer 32 overlaps the edges of the bonding pads 14. A cross-sectional view 40 showing the overlap of the solder mask layer 32 onto the bonding pad 14 is shown in FIG. 4. It should understood, however, that in alternative embodiments the solder mask layer 32 may not overlap the bonding pads 14.

Referring to FIG. 3, the pad openings 34 are tapered at one end, forming a tapered end (i.e., the smaller end) and an expanded end (i.e., the wider end) of the pad opening 34. In the illustrated embodiment, the pad openings 34 are tapered into the shape of a triangle, although in other embodiments, the pad openings 34 could be fabricated into other tapered shapes. In any case, the pad openings 34 are tapered in alternating directions to form an interdigitated pattern. That is, the tapered end of any one pad opening 34 is adjacent to the tapered end of an adjacent pad opening 34. This interdigitated solder mask pattern provides for a maximum amount of solder mask material between adjacent bonding pads 14, as described in more detail below with reference to FIG. 5.

Figure 6:
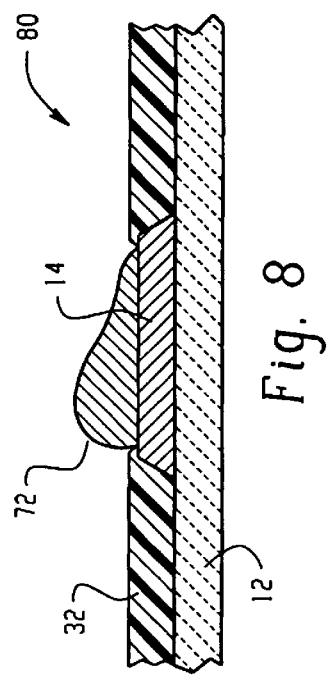

FIGS. 5 and 6 show the step of patterning solder paste 52 onto the bonding pads 14 at the expanded ends of the tapered pad openings 34. FIG. 5 is a top view 50 showing an exemplary pattern for stencil printing solder paste 52 onto the bonding pads 14. The solder paste 52 is preferably printed partially on the solder mask layer 32 and partially on the bondings pads 14 at the expanded end of the pad openings 34. As illustrated in FIG. 5, the distance between adjacent bonding pads 14 at the expanded end of the pad openings 34 may be as much as twice the distance between adjacent bonding pads 14 at the tapered end of the pad openings 34. Thus, printing the solder paste 52 at the expanded end of the pad openings 34 increases the distance between adjacent solder balls 52 and reduces the possibility of solder shorts being created during reflow. In this manner, the solder paste 52 may be printed at a pitch (2x) that is twice that of the pitch (x) of the I/O pads of the flip-chip IC.

A maximum possible distance between adjacent solder balls 52 may be achieved by overlapping the solder paste 52 onto the solder mask 32, as illustrated in FIG. 6. FIG. 6 is a cross-sectional view 60 showing the overlap of a stencil printed solder paste 52 onto the solder mask 32. In order to increase the distance between adjacent solder balls 52 and prevent solder shorts, the solder paste 52 is preferably printed onto the solder mask 32 with just enough of the solder paste 52 making contact with a bonding pad 14 to cause the solder paste 52 to migrate onto the bonding pad 14 during reflow.

Figure 7:
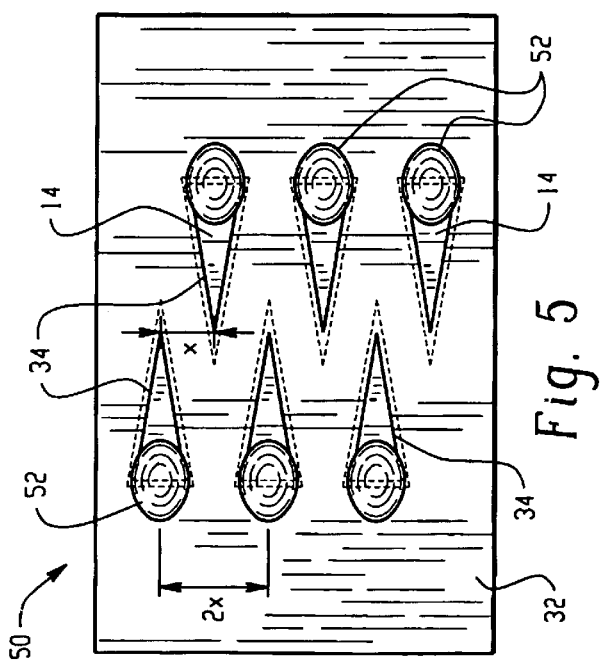
Figure 8:
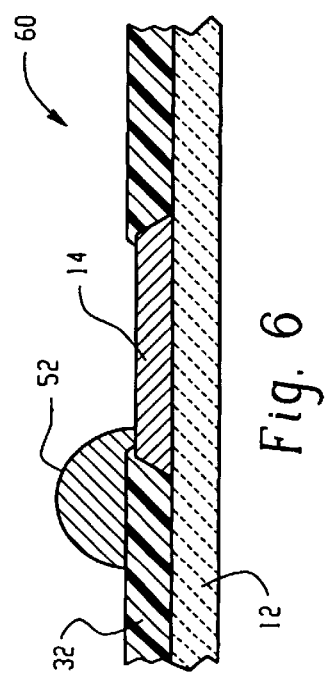

FIGS. 7 and 8 show the step of reflowing the solder 72 to create a solder bumped substrate 70. After the solder paste 52 has been printed, as described above, the entire circuit is heated to reflow the solder paste 52 onto the bonding pads 14 and create solder bumps 72. FIG. 7 is a top view 70 showing the reflowed solder 72 covering the bonding pads 14. FIG. 8 is a cross-sectional view 80 showing the solder bumped shape of the reflowed solder 72. As illustrated in FIG. 8, when the solder paste 52 is heated above its melting point, it migrates onto the exposed bonding pad 14 and forms a solder bump 72 at the expanded end of the pad opening 34.

Figure 9:
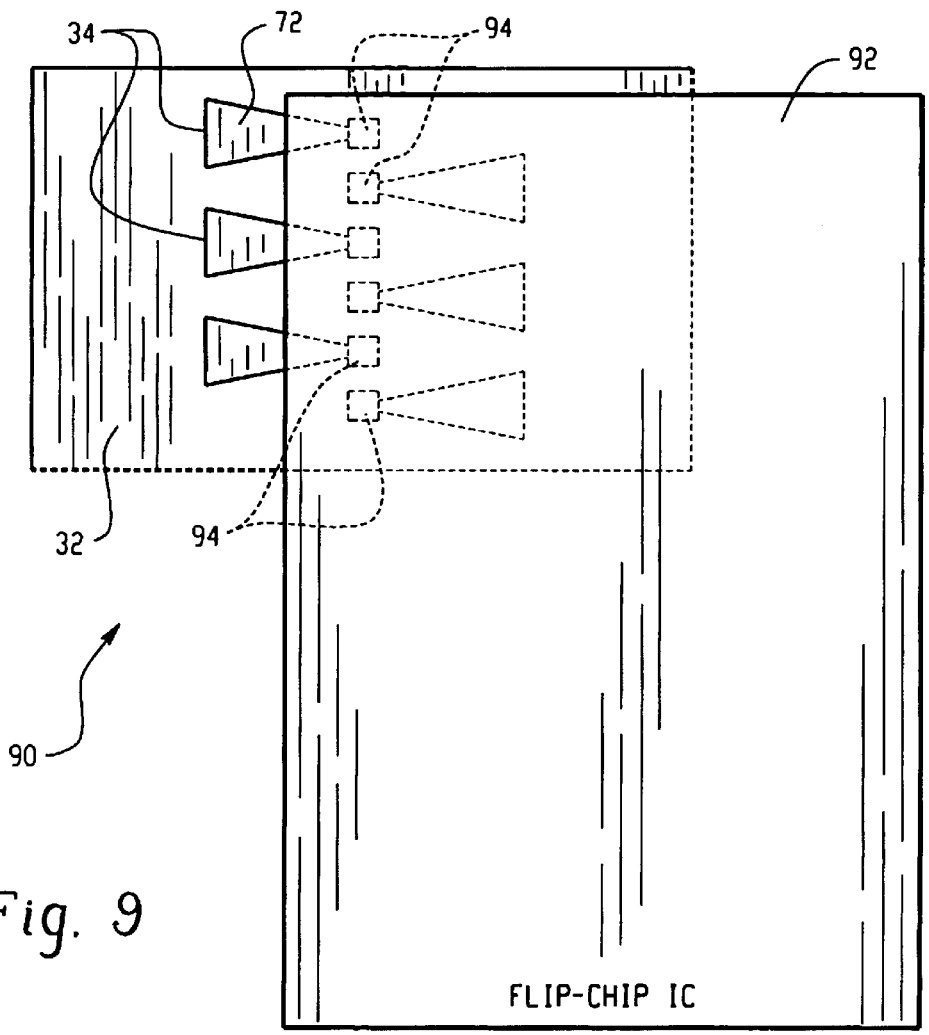
FIGS. 9 and 10 illustrate an exemplary process for attaching the fine pitch flip-chip IC package to the solder bumped substrate.
Figure 10:
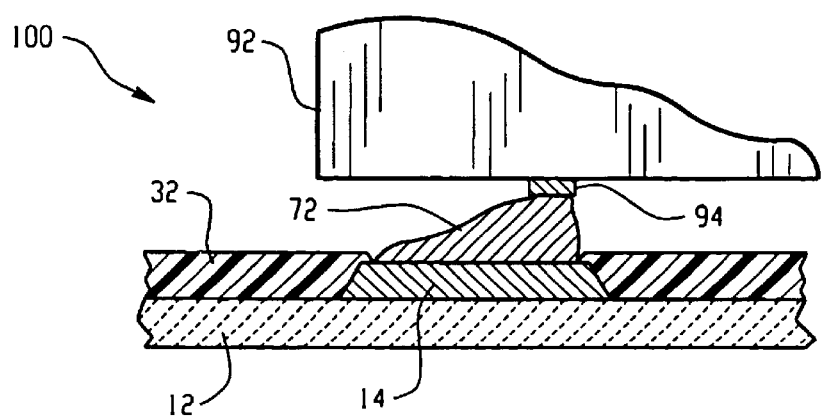

FIGS. 9 and 10 illustrate an exemplary process for attaching a fine pitch flip-chip IC package 92 to the solder bumped substrate 70. As illustrated in FIG. 9, the flip-chip IC package 92 is placed onto the solder bumped substrate 70 such that the I/O pads 94 on the lower surface of the flip-chip IC package 92 are aligned with the tapered end of the pad openings 34 and make contact with at least a portion of the solder bumps 72. In addition, a liquid or solid flux material (not shown) may also be added to the solder bumps 72 and/or the I/O pads 94 to help facilitate a reliable solder bond. The IC package 92 and solder bumped substrate 70 are then heated to reflow the solder 72 to bond with the I/O pads 94. As illustrated in FIG. 10, when the solder 72 is heated above the melting point, it migrates towards the I/O pad 94 and forms a metallurgical fine pitch attachment between the flip-chip IC 92 and carrier substrate 70.

Figure 11:
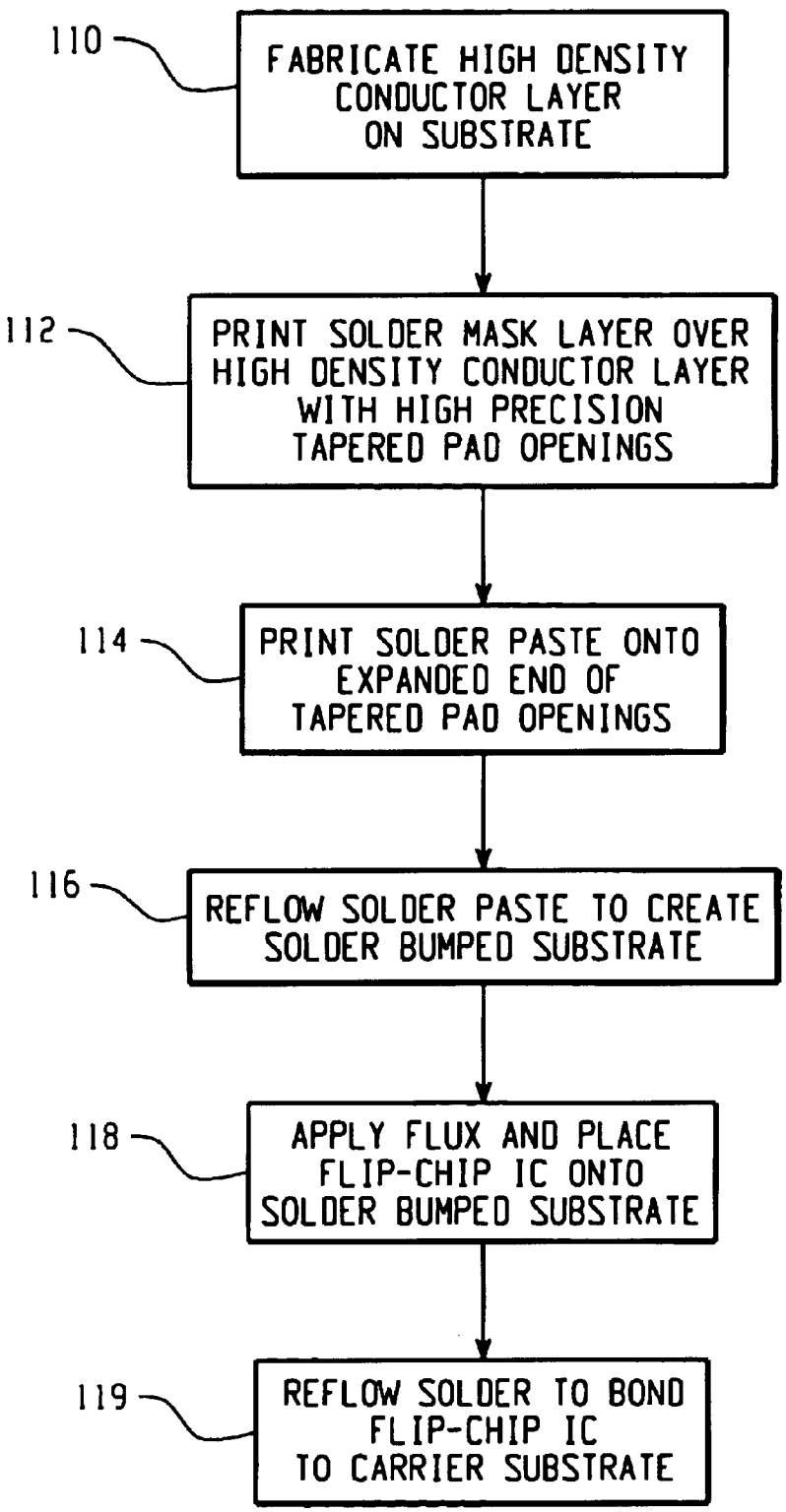
FIG. 11 is a flow diagram illustrating an exemplary method for creating a solder bumped substrate for a fine pitch flip-chip IC package.

FIG. 11 is a flow diagram illustrating an exemplary method for creating a solder bumped substrate for a fine pitch flip-chip IC package. In step 110, a high density conductor layer having circuit traces and bonding pads is fabricated, as described above with reference to FIGS. 1 and 2. In step 112, a solder mask layer is printed over the high density conductor layer, defining tapered pad openings over the bonding pads of the conductor layer, as described above with reference to FIGS. 3 and 4. In step 114, solder paste is printed onto the expanded end of the tapered pad openings, as described above with reference to FIGS. 5 an 6. The printed solder paste is then reflowed in step 116 to form a solder bumped substrate, as described above with reference to FIGS. 7 and 8. In step 118, a flux is added and the flip-chip IC package is placed onto the solder bumped substrate, as described above with reference to FIGS. 9 and 10. The solder bumped substrate and flip-chip IC package are then bonded in step 119 by applying heat to reflow the solder.

This written description uses examples to disclose the invention, including the best mode, and also to enable a person skilled in the art to make and use the invention. The patentable scope of the invention is defined by the claims, and may include other examples that occur to those skilled in the art.

It is claimed:

1. A carrier substrate for use with a flip-chip integrated circuit (IC), comprising:

a substrate material;

a conductive layer fabricated on the substrate material and having a plurality of circuit traces coupled to a plurality of bonding pads, wherein the bonding pads are interdigitated and arranged to correspond to input/output (I/O) pads on the flip-chip IC package;

a solder mask layer fabricated over the conductive layer and defining a plurality of interdigitated, tapered pad openings that expose the bonding pads, wherein the plurality of interdigitated, tapered pad openings each have a tapered end and an expanded end with the tapered ends being interdigitated such that the tapered end of each tapered pad opening is adjacent to the tapered end of at least one other tapered pad opening; and solder bumps coupled to the bonding pads through the tapered pad openings.

2. The carrier substrate of claim 1, wherein the expanded end of each tapered pad opening is adjacent to the expanded end of another tapered pad opening, and wherein the pitch between any two adjacent expanded ends is twice the pitch between any two adjacent tapered ends.

3. The carrier substrate of claim 1, wherein the bonding pads are tapered.

4. The carrier substrate of claim 2, wherein the bonding pads include a tapered end and an expanded end, and the bonding pads are interdigitated such that the tapered end of each bonding pad is adjacent to the tapered end of at least one other bonding pad.

5. The carrier substrate of claim 1, wherein the substrate material is an organic-based circuit board substrate.

6. The carrier substrate of claim 1, wherein the substrate material is ceramic.

7. The carrier substrate of claim 6, wherein the conductive layer is fabricated from a conductive thick film material.

8. The carrier substrate of claim 6, wherein the conductive layer is fabricated by chemically etching a gold-based thick film material.

9. The carrier substrate of claim 1, wherein the solder mask layer is fabricated from a photo-definable solder mask material.

10. The carrier substrate of claim 1, wherein the solder mask layer overlaps a portion of each bonding pad.

11. The carrier substrate of claim 1, wherein the tapered pad openings are triangular.

12. The carrier substrate of claim 2, wherein the bonding pads are triangular.

13. The carrier substrate of claim 1, wherein the pitch between any two adjacent tapered ends is about 0.004 inches.

14. A carrier substrate for use with a flip-chip integrated circuit (IC), comprising:

a substrate material; and a conductive layer fabricated on the substrate material and having a plurality of circuit traces coupled to a plurality of bonding pads, wherein the bonding pads have extended ends and non-extended ends, with the extended ends being interdigitated and arranged to correspond to input/output (I/O) pads on the flip-chip IC.

15. The carrier substrate of claim 14, wherein the pitch between two non-extended ends of the bonding pads is twice the pitch between two interdigitated, extended ends.

16. The carrier substrate of claim 14, wherein the pitch between any two adjacent interdigitated, extended ends is about 0.004 inches.

17. The carrier substrate of claim 14, wherein the plurality of bonding pads each have a tapered end and an expanded end with the tapered ends being interdigitated such that the tapered end of each bonding pad is adjacent to the tapered end of at least one other bonding pad.

18. The carrier substrate of claim 14, wherein a solder mask layer defining a plurality of pad openings that expose the bonding pads is fabricated over the conductive layer.

19. The carrier substrate of claim 18, wherein each of the plurality of pad openings of the solder mask layer has a tapered end and an expanded end with the tapered ends being interdigitated such that the tapered end of each pad opening is adjacent to the tapered end of at least one other pad opening.

20. The carrier substrate of claim 19, wherein the pitch between two expanded ends of the pad openings is twice the pitch between two interdigitated, tapered ends.

21. The carrier substrate of claim 19, wherein the pitch between any two adjacent interdigitated, tapered ends of the pad openings is about 0.004 inches.

22. The carrier substrate of claim 14, wherein the substrate material is an organic-based circuit board substrate.

23. The carrier substrate of claim 14, wherein the substrate material is ceramic.

24. The carrier substrate of claim 14, wherein the conductive layer is fabricated from a conductive thick film material.

25. The carrier substrate of claim 14, wherein the conductive layer is fabricated by chemically etching a gold-based thick film material.

26. The carrier substrate of claim 18, wherein the solder mask layer is fabricated from a photo-definable solder mask material.

27. The carrier substrate of claim 18, wherein the solder mask layer overlaps a portion of each bonding pad.

28. The carrier substrate of claim 17, wherein the bonding pads are triangular.

29. The carrier substrate of claim 19, wherein the tapered pad openings are triangular.

* * * * *